United States Patent [19]

Shiga

[11] Patent Number: 5,309,119
[45] Date of Patent: May 3, 1994

[54] OSCILLATING CIRCUIT WITH A RING SHAPED RESONATOR OF SUPERCONDUCTING MATERIAL COUPLED THERETO

[75] Inventor: Nobuo Shiga, Kanagawa, Japan

[73] Assignee: Sumitomo Electric Industries, Ltd., Osaka, Japan

[21] Appl. No.: 913,030

[22] Filed: Jul. 14, 1992

[30] Foreign Application Priority Data

Jul. 15, 1991 [JP] Japan ................................ 3-174190
Jul. 15, 1991 [JP] Japan ................................ 3-174191

[51] Int. Cl.$^5$ .......................................... H03B 5/18
[52] U.S. Cl. ................................ 331/99; 331/117 D; 331/117 FE
[58] Field of Search .................. 331/96, 99, 107 SL, 331/117, D, 117 FE

[56] References Cited

U.S. PATENT DOCUMENTS

| | | | |
|---|---|---|---|
| 4,185,252 | 1/1980 | Gerlach | 331/56 |
| 4,749,963 | 6/1988 | Makimoto et al. | 331/99 |
| 5,115,210 | 5/1992 | Cummings et al. | 331/99 |

FOREIGN PATENT DOCUMENTS

2631757 11/1989 France .
1-192203 8/1989 Japan .
2223371 4/1990 United Kingdom .

OTHER PUBLICATIONS

Roth et al, "A Varactor-Tuned Oscillator Using MMIC Technology", Microwave Journal, vol. 33, No. 9, Sep. 1990, pp. 223-225.

Primary Examiner—Siegfried H. Grimm
Attorney, Agent, or Firm—Cushman, Darby & Cushman

[57] ABSTRACT

An improved oscillating circuit for use in microwave frequency bands has reduced power loss and is made smaller in vertical size. The local oscillating circuit includes an MMIC oscillator which comprises a FET, and a resonator connected thereto so as to stabilize the oscillating frequency of the oscillator. The resonator is ring-shaped and arranged as close as several $\mu$m to several tens of $\mu$m to a predetermined position of a micro strip line forming a feedback loop connected to the FET forming the oscillator. Moreover, the resonator is a thin film formed by depositing a high-temperature superconducting material. As exemplary embodiments, YBCO, niobium and the like, can be used as high-temperature superconducting materials. Furthermore, a portion of the micro strip line, closest to the resonator, is concentrically disposed therewith to form a circular arc portion whose central angle is set at 90 degrees.

2 Claims, 4 Drawing Sheets

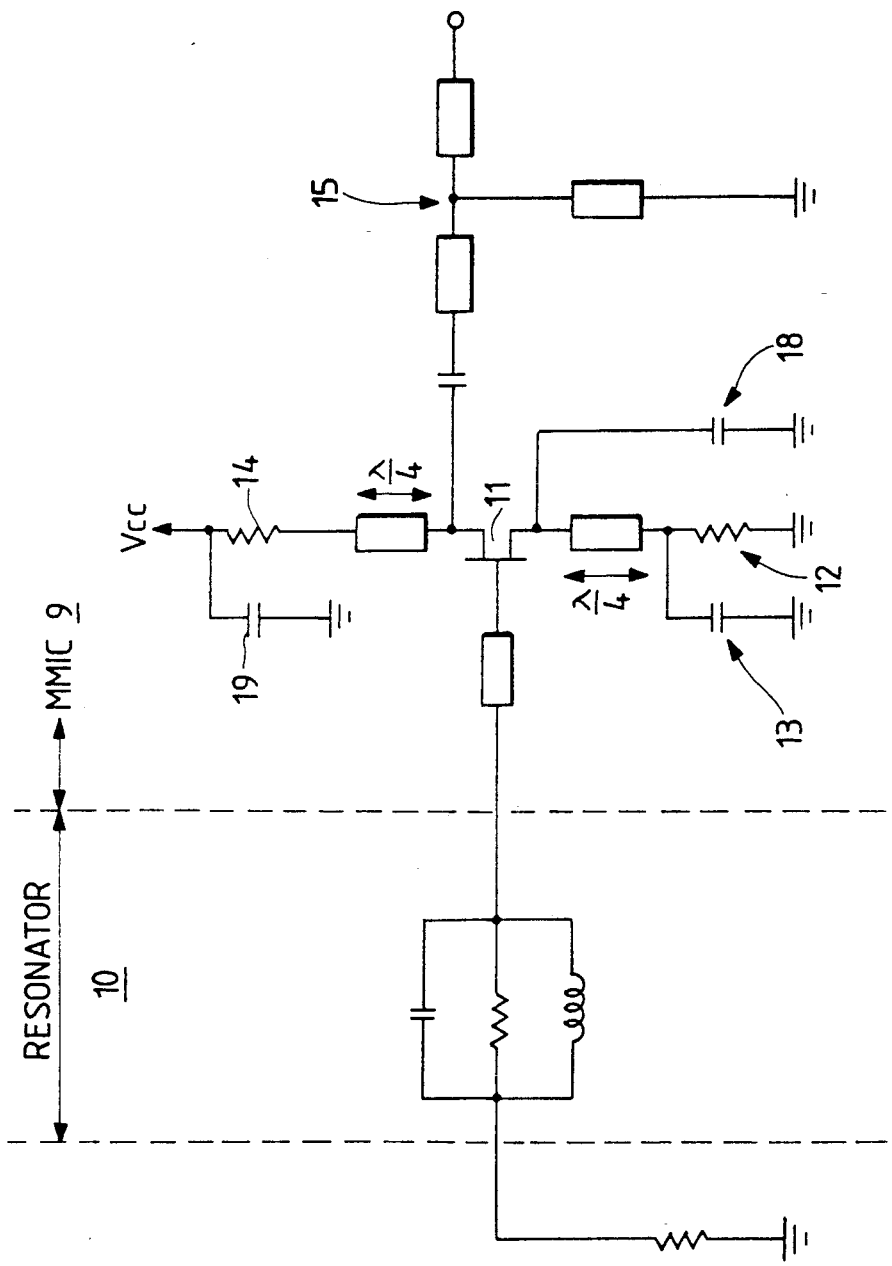

OSCILLATING CIRCUIT WITH A RING SHAPED RESONATOR OF SUPERCONDUCTING MATERIAL COUPLED THERETO

BACKGROUND OF THE INVENTION

1. Field of the Invention

The present invention relates to an oscillating circuit of the type to be formed as part of an integrated circuit and adapted for use in microwave frequency bands.

2. Description of the Prior Art

As demand for information network systems increases so does demand for satellite communication systems As a result, use of high-frequency waves such as microwaves within frequency-band designations is on the rise.

Such demand for high-frequency communications and related applications, requires also that oscillating circuits applicable as local oscillating circuits usable as down converters, for converting high-frequency signals to low-frequency signals, be provided therewith.

In designing any oscillating circuit for communication applications, an engineer must keep in mind several critical factors. Such factors include cost of manufacture and component size. For this reason, oscillating circuits made of microwave integrated circuit MIC technology, mainly composed of a transmission line (a micro strip line and the like) formed on a dielectric substrate, have been used.

SUMMARY OF THE INVENTION

In a solid frequency oscillator circuit according to the present invention, frequency stability and reduced power loss is tremendously enhanced by setting a columnar or spherical dielectric resonator, formed of high permittivity ceramic, close to a micro strip line of a feedback circuit. It is found that such a resonator results in a higher Q-factor than conventional semiconductor oscillators circuits without a resonator.

The aforementioned dielectric resonator can be approximately several millimeters in vertical width. It is noted however that the selected vertical depth is a function of resonant frequency parameters.

A micro strip line, such as thin circuit wiring and the like, but different from the dielectric resonator material, is provided to form integrated circuit conductor paths. A micro strip line is extremely thin as it is formed by evaporation.

In the above oscillating circuits of the present invention provided with a resonator, the resonator area protrudes upwardly causing a bottleneck affecting minimum MIC depth size and therefore resulting in an oscillating circuit occupying a greater volume than otherwise necessary.

In another embodiment of the present invention, an oscillating circuit is provided which overcomes this difficulty yet also operates with very little power loss and is designed to have reduced MIC depth size.

An oscillating circuit according to the second embodiment is provided having a FET formed on a semi-insulating substrate, and a ring-shaped thin film resonator made of superconducting material arranged very close to a micro strip line of a feedback circuit wiring coupled to the FET, wherein a part of the micro strip line is formed so that the part, which is situated close to the resonator, forms roughly a 90-degree circular arc in parallel with the upper most circumference of the resonator.

A signal transmitted from the oscillating circuit is reflected totally on a selective frequency basis. Thus, a highly stable oscillating circuit becomes feasible. Moreover, the ring-shaped resonator demonstrates a small radiation loss and improved performance. The resonator is formed of a superconducting thin film and therefore its surface resistance is far lower than that of a normal conductor. In addition, oscillating frequency stability is improved because the resonator has a steep frequency response characteristic with a high Q-factor.

Furthermore, MIC depth size is also reduced because the resonator is formed of a thin film. In addition, the length of the circular arc is reduced to ¼ of the circumference of the resonator since the predetermined site of the micro strip line is in the form of a substantially 90-degree circular arc in parallel to the resonator. The resonance condition between the resonator and the micro strip line appears more distinctly.

BRIEF DESCRIPTION OF THE DRAWING

FIG. 2 is an equivalent circuit diagram of the principal part of the oscillating circuit shown in FIG. 1A.

DETAILED DESCRIPTION OF THE PREFERRED EMBODIMENTS

Referring to the accompanying drawings, a detailed description will subsequently be given for the preferred embodiments of the present invention relating to an oscillating circuit having a resonator coupled thereto.

Figure 1A:
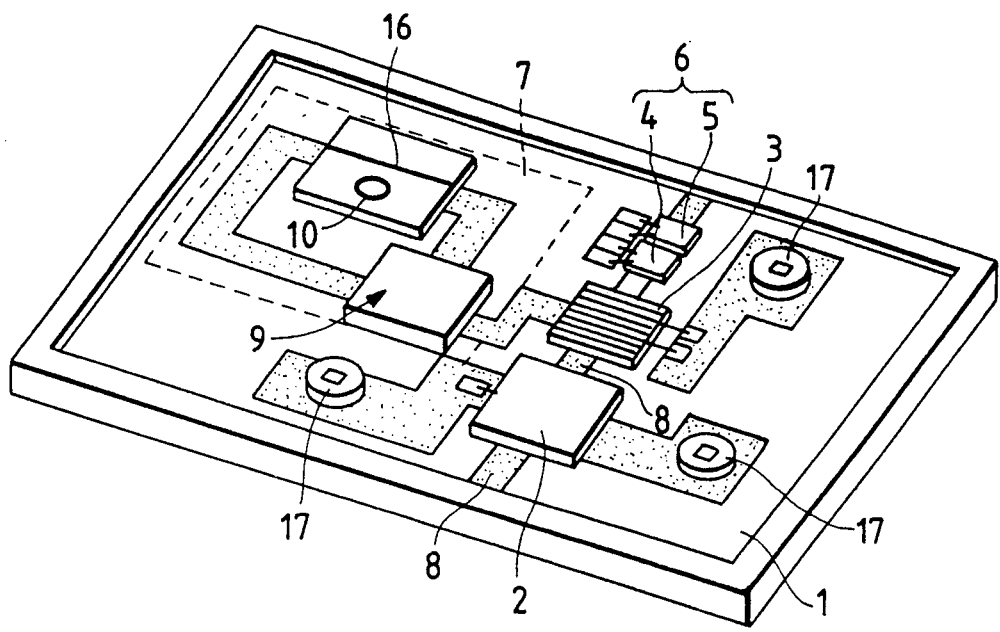
FIG. 1A is a diagram illustrating an oscillating circuit in accordance with a first preferred embodiment of the present invention.

FIG. 1A is an overall block diagram illustrating a monolithic microwave integrated circuit (MMIC) which includes incorporated thereon an oscillating circuit embodying the present invention.

The MMIC device is a microwave circuit which functions as a down converter. Included thereon are various kinds of elements arranged on a semi-insulating GaAs substrate 1.

More specifically, RF amplifier 2 is disposed on a signal input terminal side. The output terminal of the RF amplifier 2 is connected to one input terminal of mixer 3 and to intermediate frequency amplifier (IF amplifier) 6. IF amplifier 6 comprises a pre-amplifier 4 and a main amplifier 5 which are connected to receive the output signal from mixer 3.

Local oscillating circuit 7 embodying the present invention is connected to the other input terminal of the mixer 3.

As shown, micro strip line 8 is used to couple all the above elements successively.

Local oscillating circuit 7 includes MMIC oscillator 9, which uses a FET as shown in FIG. 2, and resonator 10 which is provided to stabilize an oscillating frequency of MMIC oscillator 9.

Figure 1B:
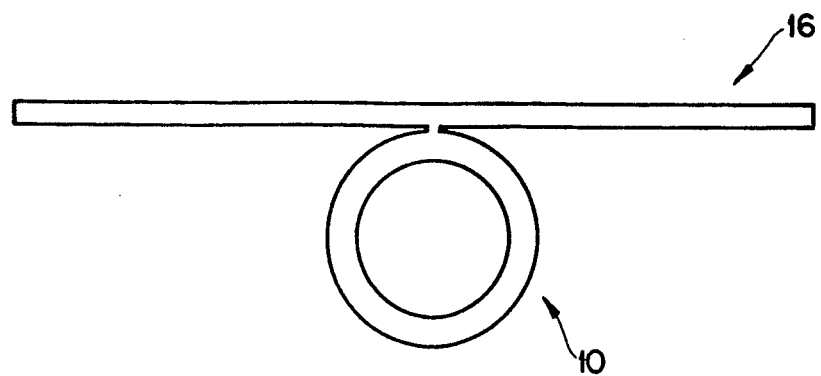
FIG. 1B is an enlarged top view illustrating a site close to the resonator shown in FIG. 1A.

An enlarged top view illustrating a site close to the resonator of FIG. 1A, is shown in FIG. 1B.

In FIG. 1B, the resonator 10 is shown as ring-shaped and arranged very close (in the range of several μm–several tens of μm) to a predetermined position of a micro strip line 16 forming a feedback loop. Moreover, resonator 10 is formed by depositing a high-temperature superconducting material during an evaporation technique.

As for the high-temperature superconducting material, yttrium (YBCO) and niobium can be used as examples of some such materials.

As shown in a schematic diagram of MMIC oscillator 9 in FIG. 2, oscillator 9 includes FET 11. The drain of FET 11 is grounded via bias resistor 12 and bypass capacitor 13. The source of FET 11 is connected via bias resistor 14 to a power supply Vcc and simultaneously to a T-type output matching circuit 15.

A feedback circuit which includes resonator 10 is coupled between the drain and the gate. In this case, the set position of the resonator 10 (i.e., the distance from FET) is properly fixed to obtain stable oscillation such that only resonance frequency affects feedback.

In a second embodiment of the present invention, a part of the micro strip line 16 is formed so that the part, which is situated close to the resonator 10, is a circular arc. The circular arc portion 16a is shown in an enlarged view of FIG. 4B, which corresponds to the resonator portion of the microwave circuit shown in FIG. 4A. The circular arc portion 16a is formed concentric with resonator 10; a central angle of the circular arc being set at 90 degrees.

The wiring of circular arc portion 16a is arranged along and in parallel to the outer periphery of resonator 10. As a result, the length of the circular arc portion 16a is reduced to a quarter of the circumference of the resonator 10.

Although the properties of the micro strip line 16 may also be improved if it is formed of high-temperature superconducting material, the use of such a superconducting material is not necessarily essential. The micro strip line 16 can be formed by evaporation of low-resistance gold.

Numeral 17 in FIG. 1 denotes a bias adjusting resistor. Feedback capacitor 18 in FIG. 2 is shown coupled between the drain of FET 11 and ground. Bypass capacitor 19 is inserted between the source of FET 11 and ground.

Figure 3A:
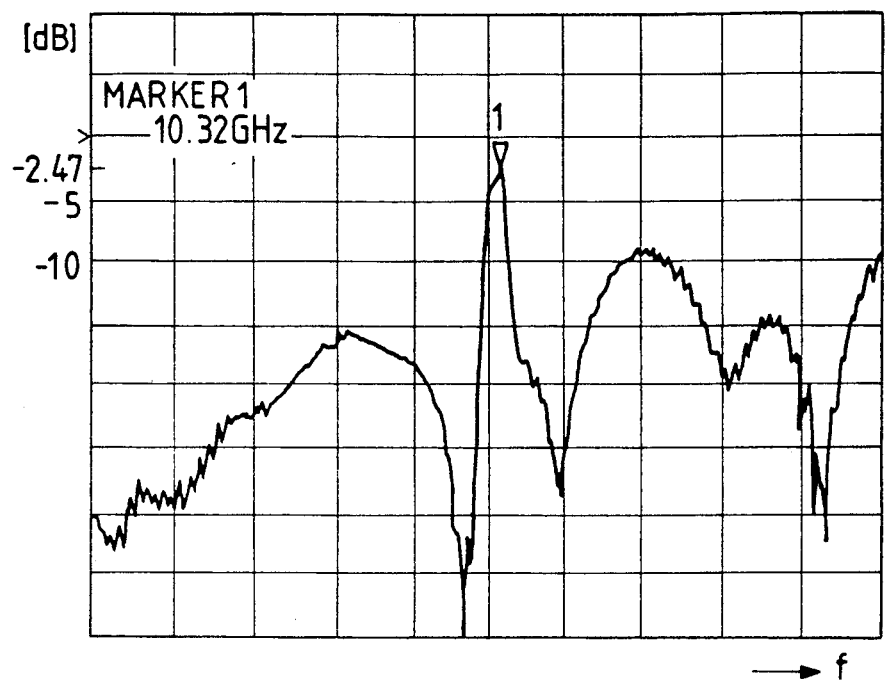
FIGS. 3A and 3B illustrate graphs showing frequency characteristics of the S parameters for the oscillating circuit in FIG. 1A.
Figure 3B:
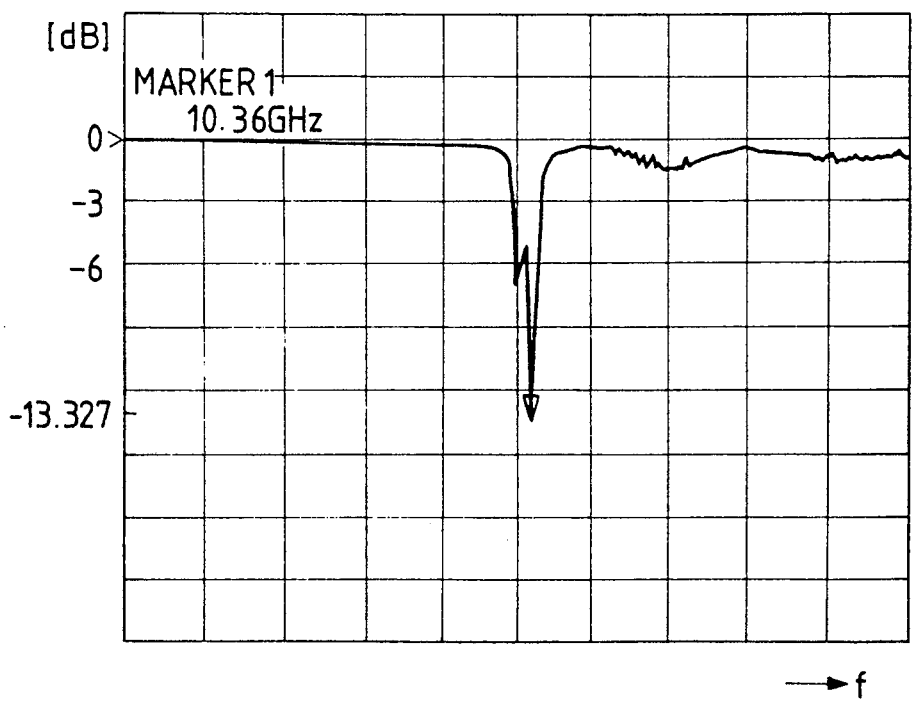

FIGS. 3A and 3B show the characteristics of the oscillating circuit of FIG. 1A which results in response to a signal from the resistive terminating side of micro strip line 16 forming a feedback loop.

FIG. 3A shows the variation of reflection loss (i.e., S11 parameter) as frequency of an input signal is changed from 2 GHz up to 18 GHz. The vertical axis represents decibel loss [dB] in 5 dB increments.

As can be seen from the response curve of FIG. 3A, the loss at a resonance frequency of 10.32 GHz is an extremely small −2.47 dB. Consequently, it is possible to ensure oscillation stably and efficiently.

As can be deduced from these results, resonance coupling is strengthened between micro strip line 16 and resonator 10 in the circuit of FIG. 1A, and the loss at the resonance frequency ranges roughly from −1.5 ~ −1.0 dB. Thus, performance is improved.

FIG. 3B shows a frequency characteristic of the S21 parameter, exhibiting a forward transmission coefficient as one of the S parameters resulting from testing the linear micro strip line.

Figure 4A:
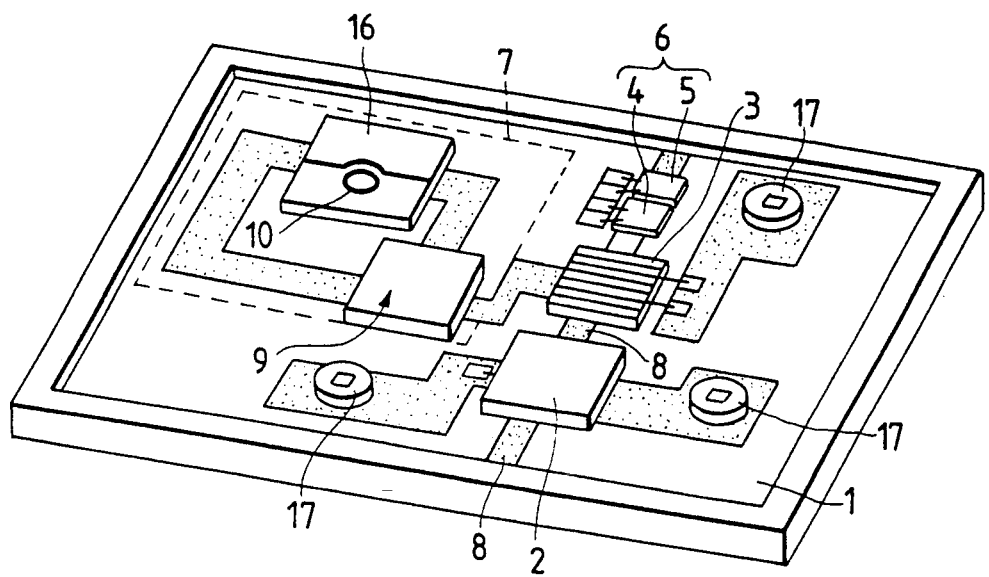
FIG. 4A is a diagram illustrating an oscillating circuit in accordance with a second preferred embodiment of the present invention.
Figure 4B:
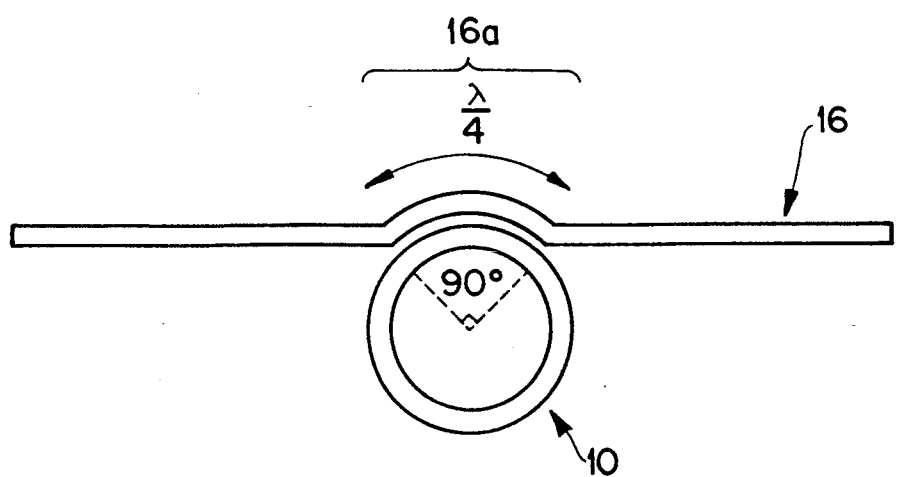
FIG. 4B is an enlarged top view illustrating a site close to the resonator shown in FIG. 2A.

As can be seen in FIG. 3B, the characteristic line appears to drop sharply at the resonance frequency. If the circular arcuate micro strip line of FIGS. 4A and 4B is employed instead, the corresponding characteristic line (not shown) can be expected to drop even more sharply.

The present invention is applicable to oscillating circuits formed with hybrid MICs, those formed with monolithic MICs, and to various related circuit arrangements as used in various configurations and applications.

As set forth above, a ring-shaped resonator is affixed to a feedback circuit employed in an oscillating circuit according to the present invention. Such a device is capable of achieving improved performance as radiation loss decreases.

Moreover, surface resistance is far lower than that of a normal conductor since the resonator is formed of a superconducting thin film. This material permits resonator 10 to have steep response characteristics and a high Q-factor, thus improving the stability of the oscillating frequency.

Furthermore, resonator 10 can be made smaller in vertical size as it is formed of a thin film by evaporation or the like, as is the micro strip line.

In addition, the length of circular arc 16a is reduced to ¼ of the circumference of resonator 10, as seen in FIG. 4B, because the predetermined site of the micro strip line is in the form of a substantially 90-degree circular arc in parallel with resonator 10.

The resonance condition between resonator 10 and micro strip line 16 appears more distinctly. It is therefore possible to produce an oscillating circuit which suffers the least loss and offers excellent characteristics.

While the invention has been particularly shown and described with reference to preferred embodiments thereof, it will be understood by those skilled in the art that the foregoing and other changes in form and details can be made therein without departing from the spirit and scope of the invention.

I claim:

1. An oscillating circuit comprising:
   a field effect transistor (FET) provided on a semi-insulating substrate;
   a ring-shaped thin film resonator; and
   a micro strip line of feedback circuit wiring connected to said FET,
   wherein said ring-shaped thin film resonator is positioned at a given close position to said micro strip line, and
   wherein apart of said micro strip line is formed so that the part, which is positioned closest to said resonator, forms approximately a 90-degree circular arc in parallel with an upper circumference of said resonator.

2. An oscillating circuit as in claim 1, wherein said resonator is made of superconducting material.

* * * * *